(12) United States Patent
Pang (10) Patent No.: US 9,111,959 B2
(45) Date of Patent: Aug. 18, 2015

(54) SEMICONDUCTOR DEVICE AND MANUFACTURE METHOD THEREOF

(71) Applicant: MagnaChip Semiconductor, Ltd., Cheongju-si (KR)

(72) Inventor: Yon Sup Pang, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/135,825

(22) Filed: Dec. 20, 2013

(65) Prior Publication Data

US 2014/0367776 A1 Dec. 18, 2014

(30) Foreign Application Priority Data

Jun. 17, 2013 (KR) ........................ 10-2013-0068975

(51) Int. Cl.
*H01L 29/66* (2006.01)
*H01L 29/78* (2006.01)
*H01L 29/10* (2006.01)

(52) U.S. Cl.
CPC ........ *H01L 29/6659* (2013.01); *H01L 29/1083* (2013.01); *H01L 29/7833* (2013.01)

(58) Field of Classification Search
CPC .................. H01L 29/66537; H01L 29/66583; H01L 29/6659; H01L 29/78; H01L 29/7835; H01L 29/0847; H01L 29/66659; H01L 29/1083
USPC ........................... 257/330, 336; 438/289, 291
See application file for complete search history.

(56) References Cited

U.S. PATENT DOCUMENTS

| | | | |
|---|---|---|---|
| 7,145,191 B1 * | 12/2006 | Teng et al. ..................... | 257/288 |
| 7,700,980 B1 | 4/2010 | Bulucea et al. | |
| 7,868,386 B2 * | 1/2011 | Thei et al. ..................... | 257/344 |

* cited by examiner

*Primary Examiner* — Monica D Harrison
(74) *Attorney, Agent, or Firm* — NSIP Law (57) ABSTRACT

A semiconductor device and a manufacturing method thereof are provided. The semiconductor device includes a well region disposed in a substrate, a gate disposed on the substrate, a halo region disposed in a channel region under the gate, and a source LDD region and a drain LDD region disposed on opposite sides of the halo region.

22 Claims, 9 Drawing Sheets
(2 of 9 Drawing Sheet(s) Filed in Color)

SEMICONDUCTOR DEVICE AND MANUFACTURE METHOD THEREOF

CROSS-REFERENCE TO RELATED APPLICATIONS

This application claims the benefit under 35 USC 119(a) of Korean Patent Application No. 10-2013-0068975 filed on Jun. 17, 2013, in the Korean Intellectual Property Office, the entire disclosure of which is incorporated herein by reference for all purposes.

BACKGROUND

1. Field

The following description relates to a semiconductor device and a method of manufacturing the same, and to a metal-oxide-semiconductor field-effect transistor (MOSFET) having a halo region separately formed in a channel region located between a source LDD region and a drain LDD region.

2. Description of Related Art

High integration of semiconductor devices demands narrower intervals to be provided between a source and a drain of a transistor, which results in a shorter channel length and a shorter gate length. The structural limitation causes deterioration in the operation of semiconductor devices due to short-channel effects and hot carrier effects.

Various methods have been suggested to the structure of such semiconductor devices in order to ameliorate or eliminate the above-mentioned limitations and to obtain a better design for semiconductor devices to meet the target specifications of device characteristics. One of the methods is the formation of a lightly doped drain (LDD) structure. An LDD structure is a widely known solution to the above-mentioned limitations, and is thus used widely in the manufacture of semiconductor devices.

An LDD region of a MOSFET is formed by implanting a lower dose of impurity ions ($N^-$ for NMOS, $P^-$ for PMOS) than the dose implanted to form a source or a drain of the MOSFET. The LDD region is located between the source or drain junction region ($N^+$ for NMOS, $P^+$ for PMOS) and the channel region under a gate electrode.

Although the LDD region can reduce strong peak field due to excessively-doped drain, the LDD region introduces a series resistance, which in turn results in another limitation that results in the deterioration of semiconductor device performance.

The impurities within the source or drain junction region may diffuse to the channel region below the gate electrode when the impurities are heat-treated during the manufacturing process. Thus, a halo region that surrounds the LDD region may be formed so as to prevent the diffusion of impurities to the channel region below the gate electrode. While the addition of a halo region can reduce short-channel effects that are mainly caused by the decreasing channel length, the addition of the halo region can also cause the performance degradation of a MOSFET. For example, the addition of the halo region can reduce drain saturation current. However, the hot carrier reliability may be low.

As mentioned above, the MOSFET channel length may be reduced down to deep sub-micron level due to improved semiconductor device integration techniques. However, this also causes various short-channel effects that have not been witnessed in the conventional long channel devices. The short-channel effects are the main cause of limitations such as low breakdown voltage due to punch-through, reduced threshold voltage, increased leakage current, and hot-carrier effect.

Among the short-channel effects, deteriorations due to hot carrier are serious concern. The hot-carrier effects include the increase of substrate current and the shift in the drain saturation current, as well as the reduction of trans-conductance. The lifetime of the device may be also shortened.

Accordingly, it is necessary to effectively control the hot carrier effects of a semiconductor device, and a structural improvement of the semiconductor device is desirable. The structural shortcoming may also result in complicated manufacture process that increases the cost of production.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a semiconductor device including a well region disposed in a substrate, a gate disposed on the substrate, a halo region disposed in a channel region under the gate, and a source LDD region and a drain LDD region disposed on opposite sides of the halo region.

The halo region may be disposed substantially at a center of the channel region under the gate.

The halo region and the well region may be doped with the same-type dopant, and the source LDD region and the drain LDD region may be doped with dopants different from the type of dopants for the halo region and the well region.

The region may include an area having a higher doping concentration than the well region.

The halo region may have a greater depth from the surface of the substrate than the source LDD region and the drain LDD region.

The halo region may have a shorter length than the gate.

Distances between the halo region and edges of the gate may be substantially the same on both sides of the halo region.

The distances may range between 0.025 µm and 0.155 µm.

The distances may decrease as a length of the halo region increases.

As a length of the halo region decreases, a threshold voltage may decrease and a drain saturation current may increase.

The halo region may be disposed substantially at a center of the channel region under the gate, and the channel region including the halo region disposed therein may have a higher doping concentration at the center than both sides.

The halo region may have a peak concentration in a range of $10^{17\text{-}18}/cm^3$ between a surface of the substrate and a depth of 0~0.2 µm from the surface of the substrate.

The halo region may include two peak concentration areas between a surface of the substrate and a depth of 0~0.1 µm from the surface of the substrate.

The first peak concentration area of the two peak concentration areas may be disposed in a vicinity of the surface of the substrate.

The second peak concentration area of the two peak concentration areas may be disposed between the surface of the substrate and a depth of 0.05~0.1 µm from the surface of the substrate.

The general aspect of the semiconductor device may further include a source junction region adjoined with the source LDD region, a drain junction region adjoined with the drain LDD region, and an isolation adjoined with the source junction region or the drain junction region, in which the source junction region or the drain junction region and the isolation are disposed in the well region.

The gate may further include: a gate oxide layer and a poly gate layer disposed on an upper surface of the substrate above the halo region and above a part of the source LDD region and a part of the drain LDD region, and spacers on sides of the gate oxide layer and the poly gate layer.

In another general aspect, there is provided a method for manufacturing a semiconductor device, the method involving forming a halo region in a well region of a substrate, forming a gate on an upper surface of the substrate above the halo region, and forming a source LDD region and a drain LDD region on opposite sides to the halo region.

The halo region may be formed substantially at a center of a channel region of the well region.

The halo region may be formed by ion implantation applied vertically from the upper surface of the substrate.

The halo region may be formed with a tilt angle of 0°.

The source LDD region and the drain LDD region may be formed by ion implantation on opposite sides of the gate, with a tilt.

The general aspect of the method may further involve forming a source junction region on a side of the source LDD region and a drain junction region on a side of the drain LDD region.

The forming of the gate may involve forming a gate oxide layer, forming a poly gate layer on the gate oxide layer, and forming spacers on opposite sides of the gate oxide layer and the poly gate layer.

Other features and aspects will be apparent from the following detailed description, the drawings, and the claims.

BRIEF DESCRIPTION OF THE DRAWINGS

The patent or application file contains a least one drawing executed in color. Copies of this patent or patent application publication with color drawing(s) will be provided by the Office upon request and payment of the necessary fee.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

In one example, a semiconductor device is provided with an improved structure, in which a halo region and an LDD region do not overlap with each other, and the halo region is formed at the center of a channel region below a gate.

To help understand the characteristics of such an example, the NMOSFET according to a first example is compared to an NMOSFET according to a second example based on various characteristics, such as, for example, doping concentration simulation in perpendicular and horizontal direction on the substrate surface, drain saturation current (Idsat), threshold voltage (VT), and hot-carrier reliability. Accordingly, a second example of an NMOSFET is explained below with reference to a 0.18 μm 3.3V MOSFET in which the gate is 20 μm and 0.35 μm in width (w) and length (l), and the oxide layer of the gate is 6 nm in thickness (t). The dimension of a first example of the NMOSFET is substantially the same as the dimension of the second example, unless pointed out below.

A semiconductor device and a manufacturing method thereof will be explained in detail below with reference to the accompanying drawings.

Figure 1:
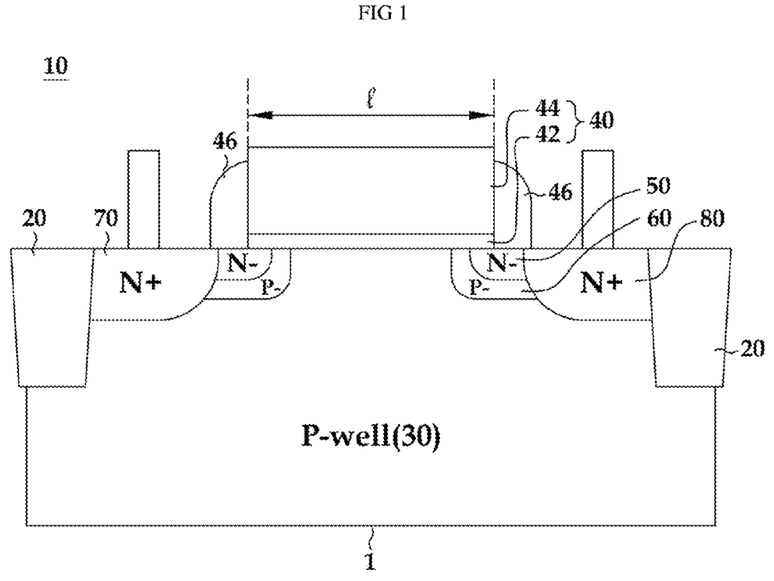
FIG. 1 is a cross-sectional view of an LDD NMOSFET device according to a first example.

FIG. 1 is a cross-section view of a halo-doped LDD NMOSFET device according to a first example. The halo-doped LDD NMOSFET device illustrated in FIG. 1 may correspond to a 0.18 μm 3.3V NMOSFET, a semiconductor device that may be used in a source driver application.

Referring to FIG. 1, an NMOSFET 10 includes a P-well 30 on a substrate 1. An isolation 20 is formed in the P-well 30.

The substrate 1 includes the P-well 30. A gate electrode 40 is formed on the substrate 1. The gate electrode 40 includes a stack of a gate oxide layer 42 and a poly gate 44. In this example, the gate electrode 40 is approximately 20 μm in width (w), and 0.35 μm in length (l), and the gate oxide layer 42 is approximately 6 nm in thickness (t). Spacers 46 made from an insulating layer material are formed to the left and the right to the gate oxide layer 42 and the poly gate 44. That is, the spacers 46 are formed on two opposite sides of the gate oxide layer 42 and the poly gate 44.

An LDD ion implantation and a halo ion implantation are performed in sequence on both lower surfaces of the substrate of the gate electrode 40. Accordingly, the halo region 60 surrounds the LDD region 50. The LDD region 50 plays a role of decreasing channel electric field in the vicinity of the drain, and doped with N-type (N⁻) dopant that is different from the P-well 30. The halo region 60 is provided to decrease short-channel effects. The halo region 60 is doped with P-type (P⁻) dopant that is the same as the P-well 30.

The ion implantation is performed to form the LDD region 50 and the halo region 60 in a state that a tilt of a predetermined angle is given due to a previously-formed gate 40.

A source junction region 70 and a drain junction region 80 are formed between the stacked structure of the LDD region 50 and the halo region 60 and the isolation 20. The source/drain junction regions 70, 80 may be formed by impurity ion implantation using the spacers 46 as masks, and by heat treatment.

Accordingly, the short-channel effect of the NMOSFET 10 is controlled by the halo region. Therefore, the shortcoming of deteriorated electric characteristic is prevented. That is, as the distance between the source and the drain in the short-channel device is reduced according to higher integration of the semiconductor devices as explained above, the leakage current of the MOSFET increases and the threshold voltage rapidly falls, causing short-channel effect. To reduce the short-channel effect, the dose of P-well ion implant may be increased, in which case the junction leakage current increases due to the increase of electric field at the drain/source junctions, and the device performance degrades. The short-channel effect can be effectively suppressed if the halo region 60 is formed in the manner explained above. However, the high electric field in the vicinity of the surface of the halo-LDD junction can degrade hot-carrier reliability.

To form the device illustrated in FIG. 1, first, the gate electrode 40 may be formed on the substrate 1. Then, the LDD region 50 may be formed. The ion implantation may be performed with a predetermined degree of tilt with respect to the gate electrode 40.

Since the ion implantation is done at a predetermined inclination in the process of manufacturing MOSFET, it is difficult to form the LDD and halo regions 50, 60 precisely at desired locations.

Figure 2:
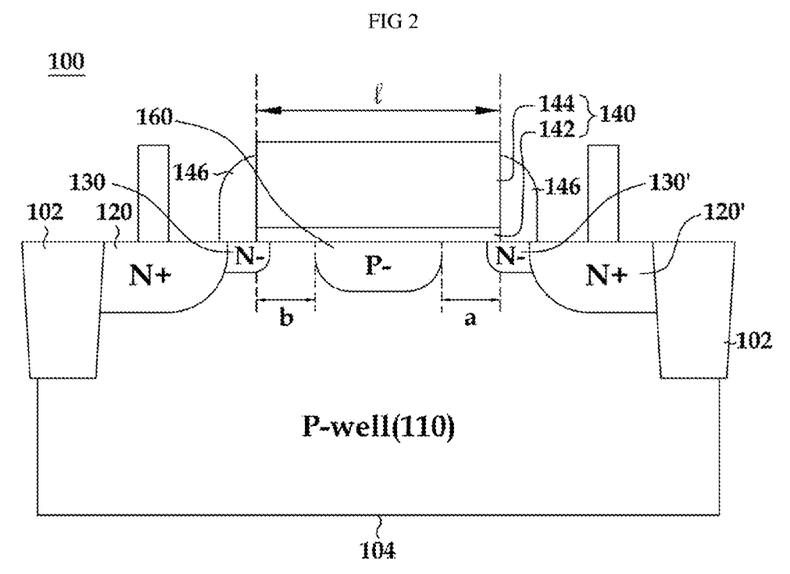
FIG. 2 is a cross-sectional view of an LDD NMOSFET device according to a second example.

FIG. 2 illustrates a MOSFET device that is manufactured with a simpler manufacturing process. The MOSFET device illustrated in FIG. 2 provides reduced short-channel effect and improved hot-carrier reliability. FIG. 2 illustrates the cross-sectional view of the NMOSFET according to the second example. For comparison with the NMOSFET according to the first example, the NMOSFET according to the second example will be referred to as a 'centered-halo-doped LDD NMOSFET.' The centered-halo-doped LDD NMOSFET may be simply referred to as an 'LDD NMOSFET.'

Referring to FIG. 2, the LDD NMOSFET 100 includes a P-well 110 formed on the substrate 104 where an isolation 102 is formed.

On one side of the two isolations 102, an N⁺ source junction region 120 and an N⁺ drain junction region 120' are formed.

An LDD ion implantation is performed in the vicinity of the N+ source junction region 120 and the N⁺ drain junction region 120' to form a source LDD region 130 and a drain LDD region 130'. The source/drain LDD regions 130, 130' are doped at a relatively lower doping concentration than the N⁺ source junction region 120 or N⁺ drain junction region 120'. That is, the source/drain LDD regions 130, 130' have N⁻ doping concentration. This results in a reduction of the high electric field at the N⁺ source/drain junction regions 120, 120'.

The source/drain LDD regions 130, 130' are relatively smaller than the N⁺ source/drain regions 120, 120', and partially overlap with the gate electrode 140, as will be explained below. The channel region includes the halo region 160 therebelow and the remaining region between the source/drain LDD regions 130, 130'.

The halo region 160 is formed by the doping at the center of the channel region below the gate electrode 140 between the source/drain LDD regions 130, 130'. The halo region 160 is relatively higher-concentration doping region than the P-well 110, because this is formed by ion implantation of the P-type dopant that is the same as the P-well 110. The distances a and b between the halo region 160 and both edges of the gate electrode 140 on opposite sides of the halo region 160 are the same. The distance a is between one side of the halo region 160 and one side of the gate close to the drain, while the distance b between the other side of the halo region 160 and the side of the gate close to the source. In one example, the distances a and b are set to 0 μm, 0.025 μm, 0.055 μm, 0.075 μm, 0.125 μm, 0.155 μm, 0.165 μm and 0.175 μm, respectively, for the purpose of comparison of characteristics. In an example in which the distances a and b are 0 μm (a=b=0 μm), a part of the halo region 160 and a part of the source/drain LDD regions 130, 130' may overlap with each other. Further, the halo region 160 may have a depth from the surface of the substrate 104 to a position located between the depth of the source/drain LDD regions 130, 130' and the depth of the source/drain junction regions 120, 120'. In another example, the depth of the centered halo region may be matched to the depth of the source/drain LDD regions 130, 130' to have the same depth. In yet another example, the depth of the halo region may be deeper than the depth of the source/drain junction regions 120, 120'.

The gate electrode 140 is the stacked structure of the gate oxide layer 142 and the poly gate layer 144. The gate electrode 140 is formed on the substrate 104 that includes the halo region 160 formed therein. As explained above, the gate electrode 140 is approximately 20 μm in width (w), and 0.35 μm in length (l). Further, the thickness (t) of the gate oxide layer 142 is approximately 6 nm Spacers 146 made of insulating layer materials are formed on the left and right sides to the gate oxide layer 142 and the poly gate layer 144.

In the LDD NMOSFET 100 formed according to the second example illustrated above, the halo region 160 is formed at the center of the channel region, and spaced apart from the sides of the source/drain LDD regions 130, 130' by the same distance. That is, the distances between both sides of the halo region 160 and both sides of the gate electrode 140 are substantially equal. By the improvement in the structure as explained above, the short-channel effect is reduced, and the hot carrier reliability is improved compared to the NMOSFET 10 of the first example. These effects are explained in greater detail below.

An example of a method of manufacturing the LDD NMOSFET device illustrated in FIG. 2 is described below. With the LDD NMOSFET 100 illustrated in FIG. 2, it is possible to form a halo region 160 by ion implantation in a direction perpendicular to the substrate 104, without requiring a predetermined tilt for such ion implantation.

Figure 3:
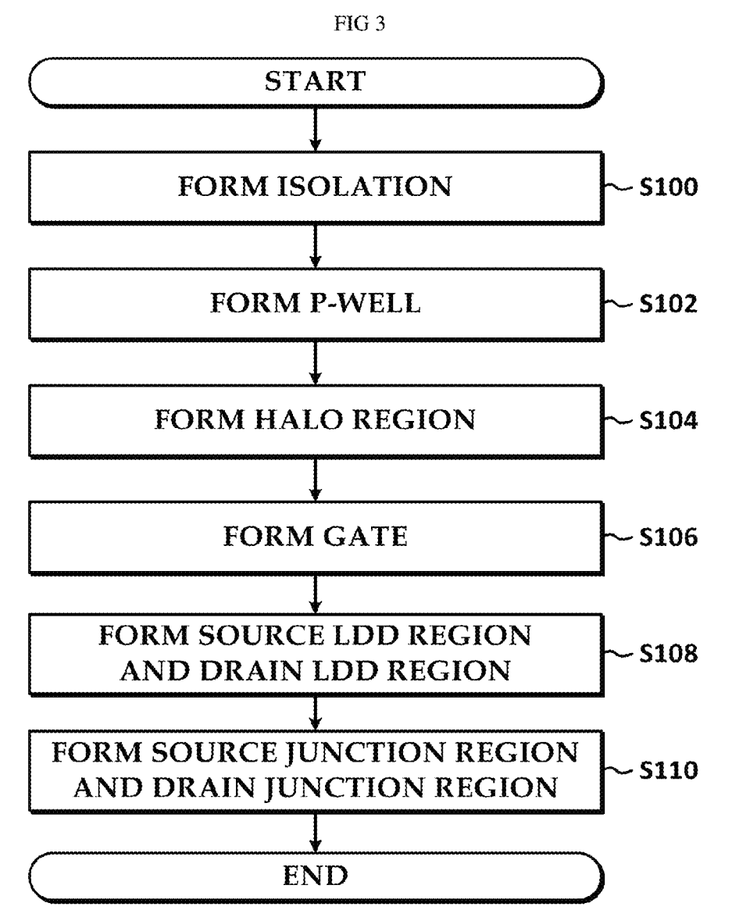
FIG. 3 is a flowchart provided to explain an example of a process of manufacturing an LDD NMOSFET device with a centered halo region.

FIG. 3 is a flowchart provided to explain an example of a manufacturing process for producing the LDD NMOSFET device according to the second example illustrated in FIG. 2.

Referring to FIG. 3, at S100, an isolation 102 is formed on the substrate 104. As it is recognized by those skilled in the art, the isolation 102 serves the function of electrically isolating the neighboring devices from each other. In a system integrated circuit (IC), various devices are integrated on one single substrate and all the neighboring devices are formed into wells. Without the isolation 102, the operation of each device will be influenced by the neighboring devices. In consequence, it causes a malfunction of the integrated circuit.

At S102, the P-well 110 is formed on the substrate where the isolation 102 is formed.

Next, at S104, the halo region 160 is formed below a location where the gate electrode 140 will be formed. The halo region 160 has a relatively higher doping concentration in comparison to the P-well 110, because the halo region 160 is formed by performing an ion implantation with the same type of dopant as the P-well 110. Although the length and depth of the halo region 160 can vary depending on the desired use of the LDD NMOSFET 100, the ion implantation is so set as to form the halo region 160 in shorter length than that of the gate electrode 140, and in depth between the depth of the source/drain junction regions 120, 120' and the depth of the source/drain LDD regions 130, 130'. In one example, the halo region 160 is formed immediately after the P-well 110 is formed. This enables formation of the halo region 160 to desired depth and length with accuracy.

After the halo region 160 is formed, at S106, the gate electrode 140 is formed. The process of forming the gate electrode 140 may involve forming the gate oxide layer 142 and the poly gate layer 144 in sequence on the substrate 104 including the halo region 160 therein, and forming spacers 146 of insulating layer materials on the left and the right sides to the gate oxide layer 142 and the poly gate layer 144.

After the gate electrode 140 is formed, at S108, the source/drain LDD regions 130,130' are formed. The source/drain LDD regions 130, 130' are formed by the ion implantation at a predetermined tilt angle with reference to the side of the gate electrode 140.

After that, at S110, the source/drain junction regions 120, 120' are formed using mask pattern. The source/drain junction regions 120, 120' have higher doping concentration than the source/drain LDD regions 130, 130'.

According to the process explained above, the LDD NMOSFET 100 with the halo region 160 and the N− LDD regions 130, 130' formed therein is manufactured.

Meanwhile, it is possible to form the source/drain junction regions 120, 120' and the source/drain LDD regions 130, 130' first and then form the gate electrode 140 in the manufacturing process of the LDD NMOSFET 100. By way of example, the source/drain LDD regions 130, 130' may be formed by an ion implantation of N type dopant, which is different from the P-well 110, using a mask pattern. The mask pattern may then be set so that the dopant ion is implanted only in the source/drain junction regions 120, 120'. The ion implantation is additionally performed with the N type dopant, to form the source/drain junction regions 120, 120'. After that, the gate electrode 140, that is a stacked structure of the gate oxide layer 142 and the poly gate layer 144, may be formed on the substrate 104 that includes the halo region 160 and part of the source/drain LDD regions 130, 130'. After that, the spacers 146 of insulating layer materials may be formed on the left and right sides to the gate oxide layer 142 and the poly gate layer 144. As a result, the LDD NMOSFET is manufactured.

According to the second example, the manufacturing process is so applied that the gate electrode 140 is formed after the halo region 160 is formed, and then the source/drain LDD regions 130, 130' are formed. The predetermined tilt angle for the ion implantation may be set to 30° when the source/drain LDD regions 130, 130' are formed.

As explained above, the difference of the second example from the first example in the entire LDD NMOSFET manufacturing process is that the halo region 160 is immediately formed after the formation of the P-well 110.

The characteristics of the NMOSFETs will be compared below between the first and second examples.

Figure 4A:
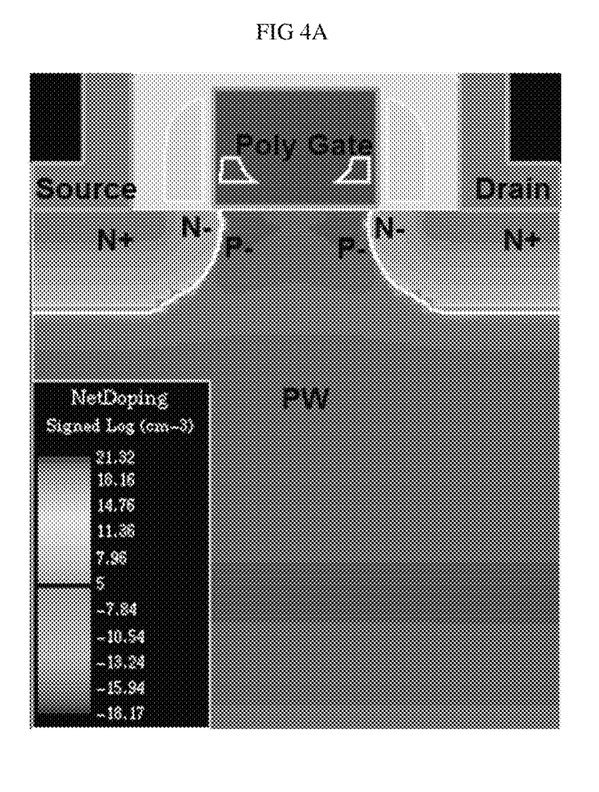
FIGS. 4A and 4B illustrate 2-dimensional net doping concentration simulations of the LDD NMOSFET according to the first example and the LDD NMOSFET according to the second example.
Figure 4B:
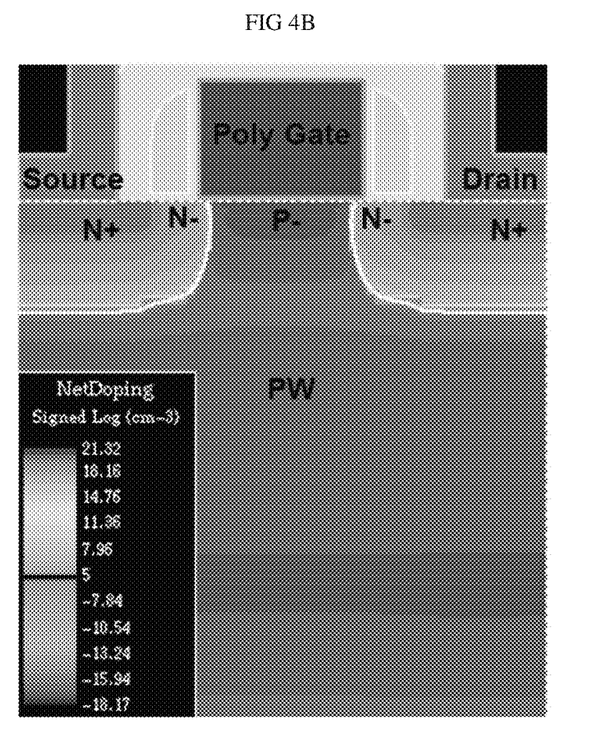

FIGS. 4A and 4B illustrate the results of two-dimensional (2D) net doping concentration simulations of an NMOSFET according to the first example illustrated in FIG. 1 and an LDD NMOSFET according to the second example illustrated in FIG. 2.

The P-well 110 and the source/drain LDD regions 130, 130' are formed with the ion implantation conditions as follows. For the P-well ion doping, boron (B) and boron fluoride ($BF_2$) were used. The dose of boron was $1.5 \times 10^{13}$ cm$^{-2}$ at 350 KeV as the energy for ion implantation, and $6.0 \times 10^{12}$ cm$^{-2}$ at 150 KeV, while the dose of boron fluoride was $2.0 \times 10^{12}$ cm$^{-2}$ at 90 KeV, and $4.0 \times 10^{12}$ cm$^{-2}$ at 50 KeV. For the LDD ion doping, phosphorus (P) was used. The dose of phosphorus was $3 \times 10^{13}$ cm$^{-2}$ at 30 KeV, and the tilt angle was 30°.

The doping concentration simulations illustrated in FIG. 4A demonstrate that the regions on the left and right sides of the channel region have a higher concentration than the center region of the channel region. That is, the center of the channel region has a lower doping concentration than both sides.

FIG. 4B illustrates the doping concentration of the LDD NMOSFET 100 according to the second example illustrated in FIG. 2. Contrary to FIG. 4A, for the LDD MOSFET 100 illustrated in FIG. 4B, the doping concentration of the center of the channel region is higher than that of the sides thereof. This doping concentration difference results from performing the additional implantation to form a halo region 160 at the center of the channel region.

As explained above, the second example has a completely different doping concentration profile in comparison to the first example. As explained above, the difference in the doping concentration profile in the second example results from forming the centered halo region 160, which has the same type dopant as that of the P-well 110, in a state that the P-well 110 is already formed in the substrate 104.

Figure 5:
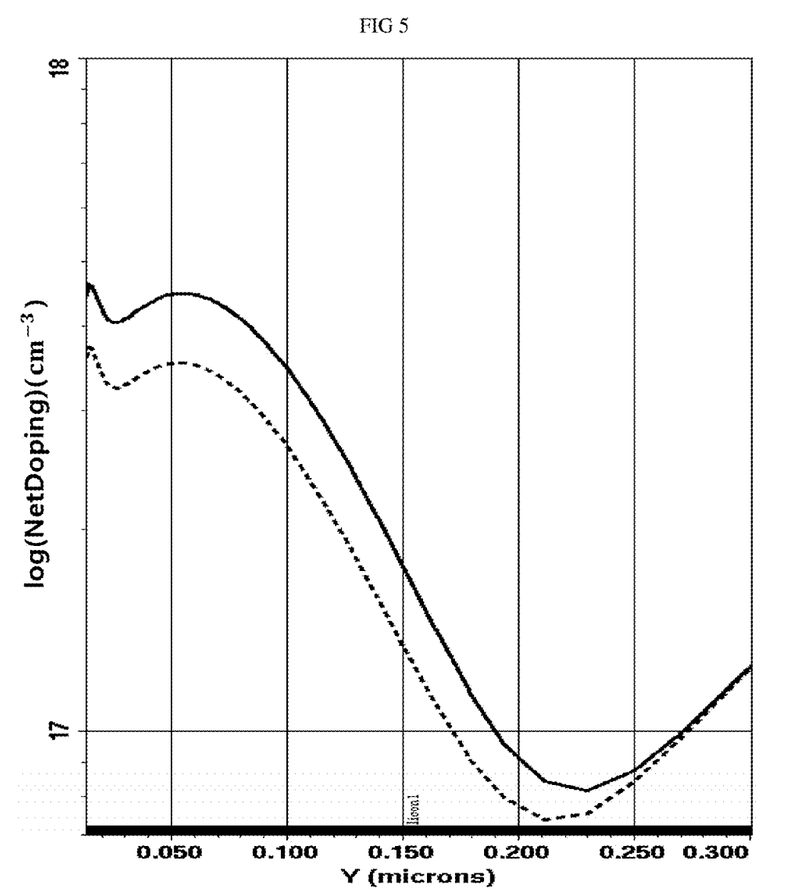
FIG. 5 is a graphical representation of a net doping profile in the perpendicular direction of the LDD NMOSFET according to the first example and the LDD NMOSFET according to the second example.

FIG. 5 is a graphical representation of the 1D net doping profile in the vertical direction of the NMOSFET according to the first example and the LDD NMOSFET according to the second example.

Referring to FIG. 5, curve A represents the doping profile of the NMOSFET according to the first example. Curve B represents the doping profile of the LDD NMOSFET according to the second example. The ion implantations of the P-well, the source/drain, and the LDD regions of the NMOSFET 10 are the same as those of the LDD NMOSFET 100. Further, the doping profile of the NMOSFET according to the first example includes the effect of the halo of dose of $1 \times 10^{13}$ cm$^{-2}$ of boron dopant at 25 KeV energy, with 30° tilt, while the doping profile of the LDD NMOSFET according to the second example includes the effect of the centered halo of dose of 2.1×10$^{12}$ cm$^{-2}$ of boron dopant at 20 KeV energy, with 0° tilt. The distances a and b between both sides of the gate electrodes 140 and both sides of the halo region 160 of the LDD NMOSFET are uniformly set to 0.075 µm.

It is apparent that both the NMOSFET 10 illustrated in FIG. 1 and the LDD NMOSFET 100 illustrated in FIG. 2 have gradually decreasing doping concentration as deeper away from the surface of the substrate 104. However, overall, the LDD NMOSFET 100 has a higher doping concentration. Further, both the NMOSFET 10 and the LDD NMOSFET 100 have a doping concentration around 10$^{17-18}$/cm$^3$ from the surface of the substrates 1 and 104 to a location of approximately 0.200 microns from the surface.

Meanwhile, the halo region 160 includes two peak concentrations. The first peak concentration is disposed in the vicinity of the surface of the substrate 104. The second peak concentration is disposed between approximately 0.050~0.100 µm from the surface of the substrate. In other words, the two peaks are located between the surface and 0.100 µm from the surface of the substrate. The first peak concentration area in the vicinity of the surface can play a role in not only controlling the threshold voltage and the drain saturation current, but also in extending life of the semiconductor device by preventing deterioration due to hot carrier. The second peak concentration area can play a role in controlling short-channel effects, by blocking the expansion of the source/drain region into the P-well area. The shallower area located between the first peak concentration area and the second peak concentration area facilitates the formation of a channel between the source and the drain. Accordingly, the concentration profile as the one illustrated in FIG. 5 is desirable.

Figure 6:
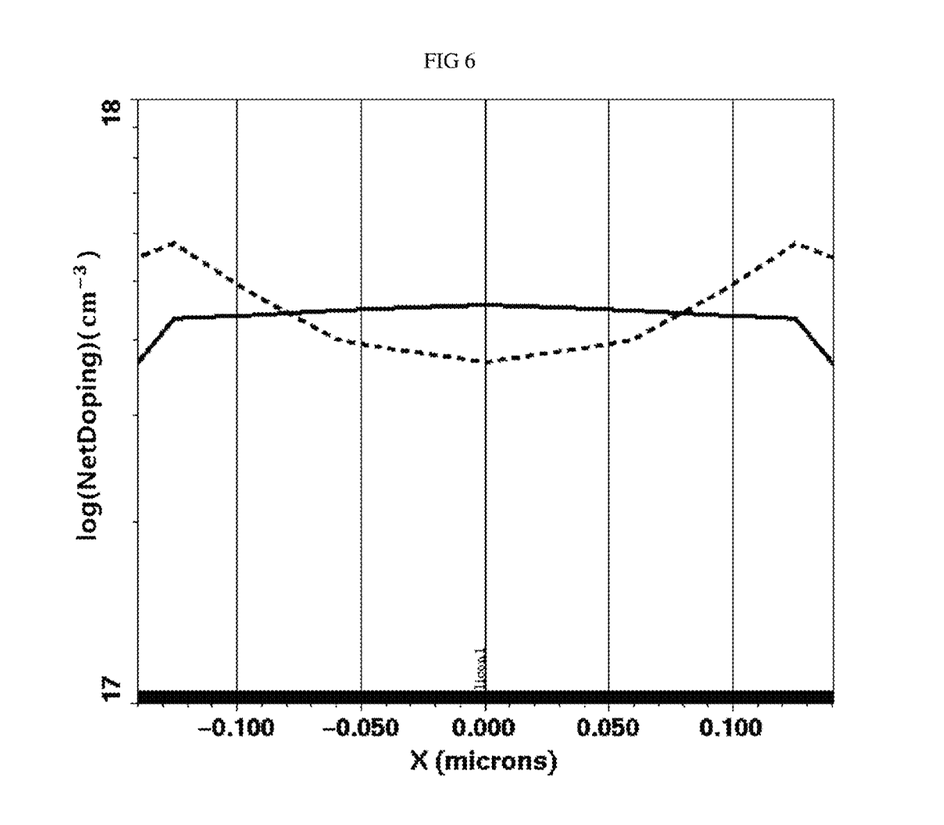
FIG. 6 is a graphical representation of a net doping profile in the horizontal direction of the LDD NMOSFET according to the first example, and the LDD NMOSFET with a centered halo region according to the second example.

FIG. 6 is a graphical representation of 1-dimensional (1D) net doping profiles in the horizontal direction at the silicon surface of the NMOSFET according to the first example, and the LDD NMOSFET according to the second example. In these examples, the same ion implantation conditions as those explained above with reference to FIG. 5 are applied.

Referring to FIG. 6, curve A represents the doping profile of the NMOSFET 10 according to the first example. FIG. 6 illustrates that curve A exhibits a higher doping concentration on both sides than that at the center of the channel region. On the contrary, doping profile curve B of the LDD NMOSFET 100 according to the second example exhibits a higher doping concentration at the center than that on the sides of the channel region.

The center of the channel region of the NMOSFET 10 according to the first example has the lowest doping concentration, and this is because the manufacturing process requires that the ion implantation for the halo region be done on both sides of the gate electrode. On the contrary, the LDD NMOSFET 100, for which the ion implantation for the centered halo region is done perpendicularly above the substrate 104, has almost similar doping concentration at the rest area other than both sides of the channel region. However, the peak doping level is at the center of the LDD NMOSFET. The length of the area of the similar halo doping concentration is approximately 0~0.2 µm. Due to the presence of the area of the similar halo doping concentration, the reliability of the device increases, and the device controllability also increases.

Figure 7:
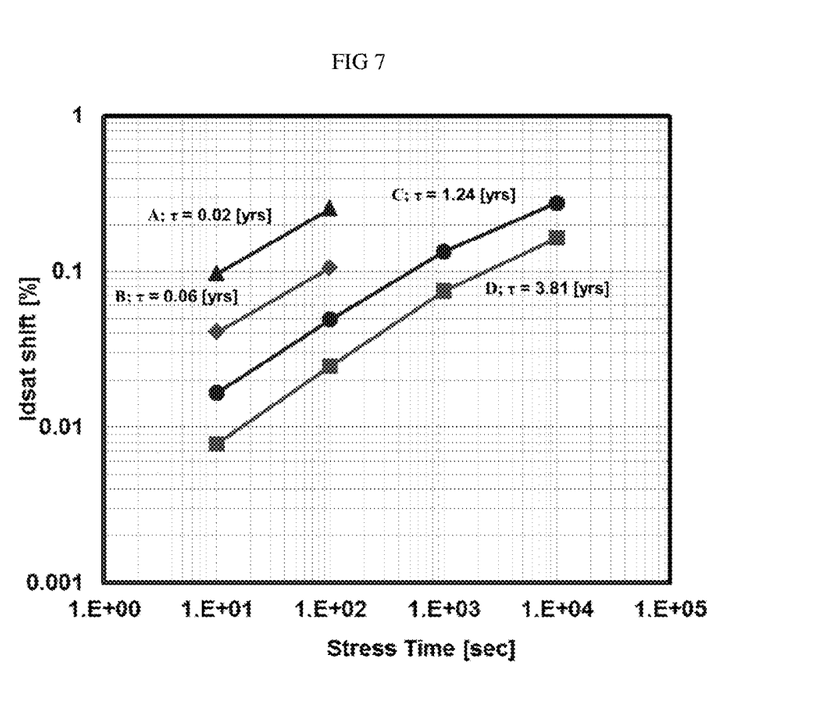
FIG. 7 is a graphical representation of the drain saturation current shift over stress time of the LDD NMOSFET with a centered halo region according to the second example and the LDD NMOSFET according to the first example, to measure hot carrier lifetime.

FIG. 7 is a graphical representation of the drain saturation current shift over stress time of the LDD NMOSFET according to the second example and the NMOSFET according to the first example, that measure hot carrier lifetime. The hot carrier lifetime t is defined as a hot-carrier stress time it takes until the drain saturation current shift reaches 10%.

Referring to the graph, X-axis represents the hot-carrier stress time (sec), and Y-axis represents the variation of Idsat in accordance with the stress. The voltage $V_{GS}$ is 1.5V, and $V_{DS}$ is 3.9V.

Accordingly, in a device in which the source LDD region 130 and the drain LDD region 130' are doped with arsenic (As) or phosphorus (P), it was confirmed that the LDD NMOSFET 100 according to the second example has approximately 3.1-fold improvement in the hot-carrier lifetime in comparison to the NMOSFET 10 according to the first example. FIG. 7 also demonstrates that the LDD NMOSFET 100 according to the second example is less subject to hot-carrier stress than the NMOSFET 10 illustrated in FIG. 1.

For example, the result of measurement indicates that when the source/drain LDD regions are doped with arsenic (As), the NMOSFET 10 has τ=0.02[yrs] (A), while the LDD NMOSFET 100 has τ=0.06[yrs] (B). The result of measurement also indicates that when the source/drain LDD regions are doped with phosphorus (P), the NMOSFET 10 has τ=1.24 [yrs] (C), while the LDD NMOSFET 100 has τ=3.81[yrs] (D). Therefore, it was confirmed that the hot carrier reliability of the LDD NMOSFET 100 is improved.

Figure 8:
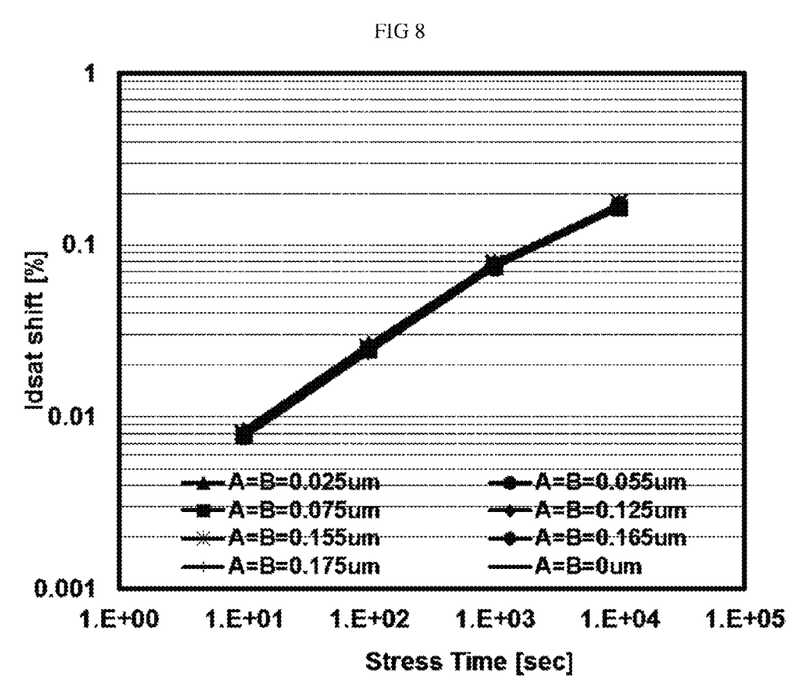
FIG. 8 is a graphical representation of the measurements of the drain saturation current shift over stress time in an NMOSFET according to the second example, when the distances a and b of the NMOSFET were uniformly changed.

The saturation current shift according to stress time was also measured for the second example while the distances a and b were changed in an equal magnitude. Accordingly, the distances a and b were the same on both sides of the halo region 160. As a result, it was confirmed that the hot carrier reliability improved even when the distances a and b are changed, as long as the distances a and b remain equal to each other.

The above is further confirmed by the graph of FIG. 8, which represents the measurements of the saturation current shift over stress time, when the distances a and b were set to 0 µm, 0.025 µm, 0.055 µm, 0.075 µm, 0.125 µm, 0.155 µm, 0.165 µm and 0.175 µm, respectively.

Referring to FIG. 8, no particular change in the drain saturation current shift was observed, when the distances a, b were set to 0 µm, 0.025 µm, 0.055 µm, 0.075 µm, 0.125 µm, 0.155 µm, 0.165 µm and 0.175 µm, respectively. This again indicates that the hot carrier reliability is improved in a device in which the halo region 160 is formed in the channel region between the source/drain LDD regions 130, 130', as in the case of the second example illustrated in FIG. 2.

Among the above examples, the most effective short channel effect control and best driving speed of the semiconductor device were determined in devices in which the distances a and b were set between 0.025 µm and 0.155 µm.

Figure 9:
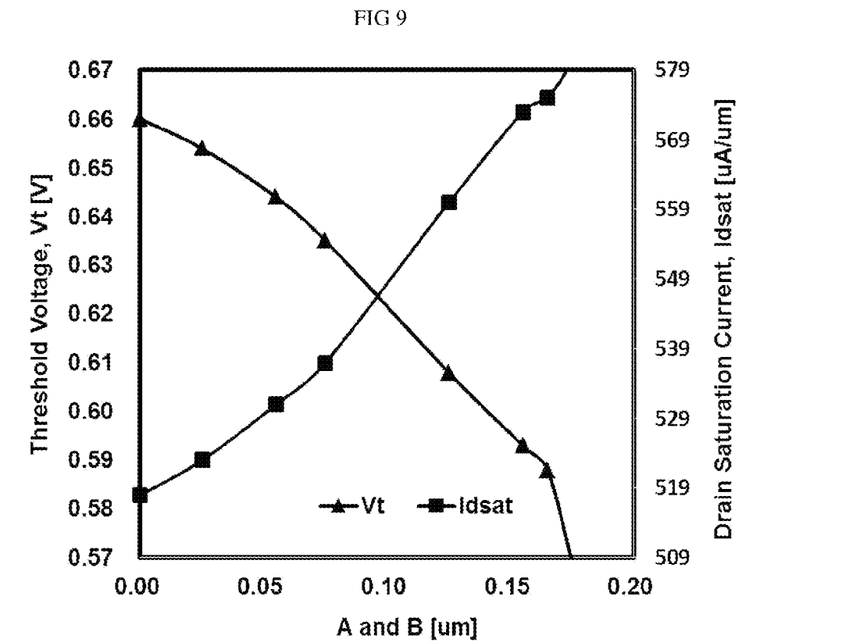
FIG. 9 is a graphical representation of the correlations between distances a and b, threshold voltage, and drain saturation current, according to the second example.

The above results are explained in detail below with reference to FIG. 9. FIG. 9 is a graphical representation of the correlations between distances a and b, threshold voltage, and drain saturation current, according to the second example.

Referring to FIG. 9, as the distances a and b increase, i.e., as the length of the halo region 160 decreases, the threshold voltage decreases, and the drain saturation current increases. Since the threshold voltage keeps decreasing until distances a and b are approximately 0.155 µm, this indicates that the distances a, b should be 0.155 µm or below in order to ensure the short-channel effect is controlled. Further, although the drain saturation current increases from the distances a and b approaching 0 µm, the distances a and b may be set to 0.025 µm or above to ensure that the driving speed of the LDD NMOSFET 100 is maintained.

As explained above, the short channel effect is reduced and the semiconductor device can maintain optimum performance, if the distances a and b are set between 0.025 µm and 0.155 µm.

In various examples as explained above, the halo region may be formed at the center of the channel region, immediately after the well region is formed. Accordingly, completely different doping profile in the horizontal direction appears, compared to a semiconductor device in which the halo region surrounds the LDD region, and enables the improved semiconductor device to control the short channel effect and to prevent deterioration due to hot carrier. In turn, the halo region formed at the center of the channel region extends the life of semiconductor devices.

Further, while various examples of the LDD MOSFET 100 explained herein keep equal distances between sides of the halo region and sides of the source/drain LDD region in forming the centered halo region, the present disclosure is not limited thereto. For example, in another example, the distance between the halo region and the source LDD region may be shorter or longer than the distance between the halo region and the drain LDD region.

In various examples of semiconductor devices described above, the halo region may be set shorter than the length of the channel, with the same distance from the edges of the source/drain LDD regions on both sides of the halo region. In such an example, short-channel effects may be controlled, and device performance (Idsat) may be maintained, while hot carrier reliability is improved. The improvement may enable meeting of targets of a source driver application, such as, for example, threshold voltage, drain saturation current, substrate current, or hot carrier lifetime. As a result, semiconductor device can have improved performance and reliability.

Further, in various examples of methods of forming semiconductor devices, the halo region is formed immediately after the well region is formed, so that the halo region is formed accurately. The halo region may be formed in the channel region after the well region is formed. Such change in the order of processing may provide an effect of accurate formation of the centered halo region in the channel region. Further, burdens such as a complicated process in forming a halo region, using ion implantations performed at a tilt on sides of the gate electrode due to the presence of a gate pattern, may be avoided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
   a well region disposed in a substrate;
   a gate disposed on the substrate;
   a halo region disposed in a channel region under the gate; and
   a source LDD region and a drain LDD region disposed on opposite sides of the halo region,
   wherein the halo region is spaced apart from the source LDD region and the drain LDD region, and is disposed substantially at a center of the channel region under the gate.

2. The semiconductor device of claim 1, wherein the halo region and the well region are doped with the same-type dopant, and the source LDD region and the drain LDD region are doped with dopants different from the type of dopants for the halo region and the well region.

3. The semiconductor device of claim 2, wherein the halo region comprises an area having a higher doping concentration than the well region.

4. The semiconductor device of claim 2, wherein the halo region has a greater depth from the surface of the substrate than the source LDD region and the drain LDD region.

5. The semiconductor device of claim 2, wherein the halo region has a shorter length than the gate.

6. The semiconductor device of claim 2, wherein distances between the halo region and edges of the gate are substantially the same on both sides of the halo region.

7. The semiconductor device of claim 6, wherein the distances range between 0.025 µm and 0.155 µm.

8. The semiconductor device of claim 6, wherein the distances decrease as a length of the halo region increases.

9. The semiconductor device of claim 8, wherein, as a length of the halo region decreases, a threshold voltage decreases and a drain saturation current increases.

10. The semiconductor device of claim 1, wherein the halo region comprises two peak concentration areas between a surface of the substrate and a depth of 0~0.1 µm from the surface of the substrate.

11. The semiconductor device of claim 10, wherein the first peak concentration area of the two peak concentration areas is disposed in a vicinity of the surface of the substrate.

12. The semiconductor device of claim 10, wherein the second peak concentration area of the two peak concentration areas is disposed between the surface of the substrate and a depth of 0.05~0.1 µm from the surface of the substrate.

13. The semiconductor device of claim 1, further comprising:
   a source junction region adjoined with the source LDD region;
   a drain junction region adjoined with the drain LDD region; and
   an isolation adjoined with the source junction region or the drain junction region, wherein the source junction region or the drain junction region and the isolation are disposed in the well region.

14. The semiconductor device of claim 1, wherein the gate further comprises: a gate oxide layer and a poly gate layer disposed on an upper surface of the substrate above the halo region and above a part of the source LDD region and a part of the drain LDD region; and spacers on sides of the gate oxide layer and the poly gate layer.

15. A semiconductor device, comprising:
   a well region disposed in a substrate;
   a gate disposed on the substrate;
   a halo region disposed in a channel region under the gate; and
   a source LDD region and a drain LDD region disposed on opposite sides of the halo region, wherein the halo region and the well region are doped with the same-type dopant, and the source LDD region and the drain LDD region are doped with dopants different from the type of dopants for the halo region and the well region; and the halo region is disposed substantially at a center of the channel region under the gate, and the channel region including the halo region disposed therein has a higher doping concentration at the center than both sides.

16. The semiconductor device of claim 15, wherein the halo region has a peak concentration in a range of $10^{17-18}/cm^3$ between a surface of the substrate and a depth of 0~0.2 μm from the surface of the substrate.

17. A method for manufacturing a semiconductor device, comprising:
    forming a halo region in a well region of a substrate;
    forming a gate on an upper surface of the substrate above the halo region; and
    forming a source LDD region and a drain LDD region on opposite sides to the halo region such that the source LDD region and the drain LDD region are spaced apart from the halo region,
    wherein tie halo region is formed substantially at a center of the channel region under the gate.

18. The method of claim 17, wherein the halo region is formed by ion implantation applied vertically from the upper surface of the substrate.

19. The method of claim 18, wherein the halo region is formed with a tilt angle of 0°.

20. The method of claim 17, wherein the source LDD region and the drain LDD region are formed by ion implantation on opposite sides of the gate, with a tilt.

21. The method of claim 17, further comprising forming a source junction region on a side of the source LDD region and a drain junction region on a side of the drain LDD region.

22. The method of claim 17, wherein the forming of the gate comprises:
    forming a gate oxide layer;
    forming a poly gate layer on the gate oxide layer; and
    forming spacers on opposite sides of the gate oxide layer and the poly gate layer.

* * * * *